(12) United States Patent
Joo et al.

(10) Patent No.: US 10,615,372 B2
(45) Date of Patent: Apr. 7, 2020

(54) LIGHT EMITTING DEVICE AND DISPLAY APPARATUS INCLUDING THE SAME

(71) Applicants: SAMSUNG ELECTRONICS CO., LTD., Suwon-si (KR); THE BOARD OF TRUSTEES OF THE LELAND STANFORD JUNIOR UNIVERSITY, Stanford, CA (US)

(72) Inventors: Wonjae Joo, Seongnam-si (KR); Mark L. Brongersma, Stanford, CA (US); Majid Esfandyarpour, Stanford, CA (US)

(73) Assignees: SAMSUNG ELECTRONICS CO., LTD., Suwon-si (KR); THE BOARD OF TRUSTEES OF THE LELAND STANFORD JUNIOR UNIVERSITY, Stanford, CA (US)

( * ) Notice: Subject to any disclaimer, the term of this patent is extended or adjusted under 35 U.S.C. 154(b) by 0 days.

(21) Appl. No.: 16/230,527

(22) Filed: Dec. 21, 2018

(65) Prior Publication Data

US 2019/0198817 A1    Jun. 27, 2019

Related U.S. Application Data

(60) Provisional application No. 62/609,475, filed on Dec. 22, 2017.

(30) Foreign Application Priority Data

Oct. 11, 2018    (KR) .................. 10-2018-0121186

(51) Int. Cl.
*H01L 51/52*    (2006.01)
*H01L 27/32*    (2006.01)
(Continued)

(52) U.S. Cl.
CPC ........ *H01L 51/5265* (2013.01); *H01L 27/322* (2013.01); *H01L 27/3211* (2013.01);
(Continued)

(58) Field of Classification Search
CPC ............... H01L 51/5265; H01L 27/322; H01L 27/3211; H01L 51/5206; H01L 51/5012; H01L 51/5056; H01L 51/5072
See application file for complete search history.

(56) References Cited

U.S. PATENT DOCUMENTS 8,692,237 B2   4/2014   Kim et al.
8,835,938 B2 *   9/2014   Hata ................... H01L 33/0079
                                                                                                                              257/13
(Continued)

FOREIGN PATENT DOCUMENTS

KR   10-2017-0055239 A   5/2017
KR   10-2017-0127954 A   11/2017
WO   2017/082677 A1   5/2017

OTHER PUBLICATIONS

Communication dated May 14, 2019, issued by the European Patent Office in counterpart European Application No. 18213543.4.
(Continued)

*Primary Examiner* — Dung A. Le
(74) *Attorney, Agent, or Firm* — Sughrue Mion, PLLC

(57) ABSTRACT

A light emitting device including a micro cavity having a phase modulation surface and a display apparatus including the light emitting device are provided. The light emitting device includes a reflective layer including a phase modulation surface; a first electrode disposed on the phase modulation surface of the reflective layer; a light emitting structure disposed on the first electrode; and a second electrode disposed on the light emitting structure. The phase modulation surface may include a plurality of nano scale patterns that are regularly or irregularly arranged. The reflective layer
(Continued)

and the second electrode may constitute the micro cavity having a resonance wavelength of the light emitting device.

30 Claims, 13 Drawing Sheets

(51) Int. Cl.
*H01L 51/50* (2006.01)
*H01L 33/46* (2010.01)

(52) U.S. Cl.
CPC ........ *H01L 33/465* (2013.01); *H01L 51/5012* (2013.01); *H01L 51/5056* (2013.01); *H01L 51/5072* (2013.01); *H01L 51/5092* (2013.01); *H01L 51/5206* (2013.01); *H01L 51/5218* (2013.01); *H01L 51/5221* (2013.01); *H01L 51/5271* (2013.01); *H01L 51/5275* (2013.01); *H01L 2251/5315* (2013.01)

(56) References Cited

U.S. PATENT DOCUMENTS

| | | |
|---|---|---|
| 2004/0149984 A1 | 8/2004 | Tyan et al. |
| 2007/0102692 A1* | 5/2007 | Asahara ................ H01L 33/387 257/13 |
| 2009/0026478 A1* | 1/2009 | Yoon ................... H01L 33/0079 257/98 |
| 2010/0141612 A1 | 6/2010 | Desieres et al. |
| 2010/0219427 A1 | 9/2010 | Fukuda |
| 2011/0101386 A1 | 5/2011 | Fukuda |
| 2015/0228929 A1 | 8/2015 | Lamansky et al. |
| 2017/0005235 A1 | 1/2017 | Chou et al. |
| 2017/0025571 A1* | 1/2017 | Kim ...................... H01L 33/145 |

OTHER PUBLICATIONS

Majid Esfandyarpour et al., "Metamaterial mirrors in optoelectronic devices", Articles, Nature Nantechnology, vol. 9, Jul. 2014, pp. 542-547. (6 pages total).

Tyler Fleetham et al., "Improved out-coupling efficiency from a green microcavity OLED with a narrow band emission source", Organic Electronics, vol. 37, May 30, 2016, pp. 141-147. (7 pages total).

W.C. Tien et al., "Narrow-band emitting microcavity OLED with ITO DBR electrode for sensing applications", Electronics Letters, vol. 51, No. 24, Nov. 19, 2015, pp. 2034-2035. (2 pages total).

Tobias Schwab et al., "Eliminating Micro-Cavity Effects in White Top-Emitting OLEDs by Ultra-Thin Metallic Top Electrodes", Advanced Optical Materials, vol. 1, 2013, pp. 921-925. (5 pages total).

* cited by examiner

LIGHT EMITTING DEVICE AND DISPLAY APPARATUS INCLUDING THE SAME

CROSS-REFERENCE TO RELATED APPLICATIONS

This application claims priority from U.S. Patent Application No. 62/609,475, filed on Dec. 22, 2017, in the U.S. Patent and Trademark Office, and Korean Patent Application No. 10-2018-0121186, filed on Oct. 11, 2018, in the Korean Intellectual Property Office, the disclosures of which are incorporated herein by reference in their entireties.

BACKGROUND

1. Field

Apparatuses and methods consistent with exemplary embodiments relate to a light emitting device and a display apparatus including the light emitting device, and more particularly to, an organic light emitting device including a micro cavity having a phase modulation surface and an organic light emitting display apparatus including the organic light emitting device.

2. Description of the Related Art

An organic light emitting device (OLED) is a display device that forms an image via light emission according to a combination of holes supplied from an anode and electrons supplied from a cathode in an organic emission layer. The OLED has excellent display characteristics such as a wide viewing angle, a fast response speed, a thin thickness, a low manufacturing cost, and a high contrast.

Further, the OLED may emit a desired color by selecting an appropriate material as a material of the organic emission layer. Accordingly, it may be possible to manufacture a color display apparatus by using the OLED. For example, an organic emission layer of a blue pixel may include an organic material that generates blue light, an organic emission layer of a green pixel may include an organic material that generates green light, and an organic emission layer of a red pixel may include an organic material that generates red light. Alternatively, a white OLED may be manufactured by arranging a plurality of organic materials which respectively generate blue light, green light, and red light in one organic emission layer or by arranging pairs of two or more kinds of organic materials in a complementary relationship with each other.

SUMMARY

According to an aspect of an exemplary embodiment, there is provided a light emitting device including: a metal reflective layer including a phase modulation surface; a first electrode disposed on the phase modulation surface of the metal reflective layer; a second electrode disposed to oppose the first electrode; and a light emitting structure disposed between the first electrode and the second electrode to form a micro cavity having a resonance wavelength of the light emitting device, wherein the phase modulation surface includes a plurality of nano light resonance structures, the plurality of nano light resonance structures being column type magnetic resonators in which a magnetic field component of incident light resonates at a periphery of nano scale patterns, and wherein the resonance wavelength of the micro cavity is determined according to a phase delay caused by the plurality of nano light resonance structures and an optical distance between the metal reflective layer and the second electrode.

The first electrode may be a transparent electrode, and the second electrode may be a transflective electrode that reflects a part of light and transmits another part of the light.

The second electrode may include a reflective metal, and an entire thickness of the second electrode is about 10 nm to about 20 nm.

The first electrode may be a transparent electrode, the second electrode may be a reflective electrode, and the metal reflective layer may have a transflective property so that the metal reflective layer reflects a part of light and transmits another part of the light.

The metal reflective layer may include silver (Ag) or an alloy including silver (Ag).

The phase modulation surface may include a plurality of patterns that are regularly or irregularly arranged.

A phase delay of reflected light caused by the phase modulation surface may be greater than a phase delay by an effective optical distance determined by multiplying a height of the patterns by a refractive index of the patterns.

A part of the first electrode may be filled in a concave area of the patterns of the phase modulation surface.

The light emitting device may further include a dielectric substance filled in a concave area of the patterns of the phase modulation surface.

The light emitting device may further include a dielectric layer disposed between the phase modulation surface and the first electrode, wherein a part of the dielectric layer is filled in a concave area of the patterns of the phase modulation surface.

A diameter of each of the patterns of the phase modulation surface may be about 50 nm to about 150 nm.

A height of each of the patterns of the phase modulation surface may be 0 nm to about 150 nm.

A period of the patterns of the phase modulation surface may be about 100 nm to about 300 nm.

When a resonance wavelength of the micro cavity is λ, a diameter of each of the patterns of the phase modulation surface, a height of each of the patterns, and a period of the patterns are selected such that an optical length of the micro cavity is equal to n×λ/2, wherein n is a natural number.

The light emitting structure may include a hole injection layer disposed on the first electrode; a hole transport layer disposed on the hole injection layer; an organic emission layer disposed on the hole transport layer; an electron transport layer disposed on the organic emission layer; and an electron injection layer disposed on the electron transport layer.

According to an aspect of another embodiment, there is provided a display apparatus including: a first pixel configured to emit light of a first wavelength; and a second pixel configured to emit light of a second wavelength different from the first wavelength, wherein each of the first pixel and the second pixel includes: a metal reflective layer including a phase modulation surface; a first electrode disposed on the phase modulation surface of the metal reflective layer; a second electrode disposed to oppose the first electrode; a light emitting structure disposed between the first electrode and the second electrode to form a micro cavity having a resonance wavelength, wherein the phase modulation surface includes a plurality of nano light resonance structures, the plurality of nano light resonance structures being column type magnetic resonators in which a magnetic field component of incident light resonates at a periphery of nano scale patterns, and wherein the resonance wavelength of the micro cavity is determined according to a phase delay caused by the plurality of nano light resonance structures and an optical distance between the metal reflective layer and the second electrode.

The phase modulation surface may include a plurality of patterns that are regularly or irregularly arranged.

A diameter of each of the patterns of the phase modulation surface of the first pixel, a height of each of the patterns, and a period of the patterns may be selected such that the resonance wavelength of the micro cavity of the first pixel corresponds to the first wavelength and a diameter of each of the patterns of the phase modulation surface of the second pixel, a height of each of the patterns, and a period of the patterns are selected such that the resonance wavelength of the micro cavity of the second pixel corresponds to the second wavelength.

When the first wavelength is $\lambda_1$, and the second wavelength is $\lambda_2$, an optical length of the micro cavity of the first pixel may be $n \times \lambda_1/2$, and an optical length of the micro cavity of the second pixel may be $n \times \lambda_2/2$, and wherein a physical distance between the second electrode and the phase modulation surface in the first pixel is same as a physical distance between the second electrode and the phase modulation surface in the second pixel.

The light emitting structure may include: a hole injection layer disposed on the first electrode; a hole transport layer disposed on the hole injection layer; an organic emission layer disposed on the hole transport layer and configured to generate both light of a first wavelength and light of a second wavelength; an electron transport layer disposed on the organic emission layer; and an electron injection layer disposed on the electron transport layer.

The light emitting structure may include: a hole injection layer disposed on the first electrode; a hole transport layer disposed on the hole injection layer; an organic emission layer disposed on the hole transport layer; an electron transport layer disposed on the organic emission layer; and an electron injection layer disposed on the electron transport layer, wherein the organic emission layer of the first pixel is configured to generate light of the first wavelength, and the organic emission layer of the second pixel is configured to generate light of the second wavelength.

BRIEF DESCRIPTION OF THE DRAWINGS

The above and/or other aspects will be more apparent by describing certain exemplary embodiments, with reference to the accompanying drawings, in which.

DETAILED DESCRIPTION

Figure 1:
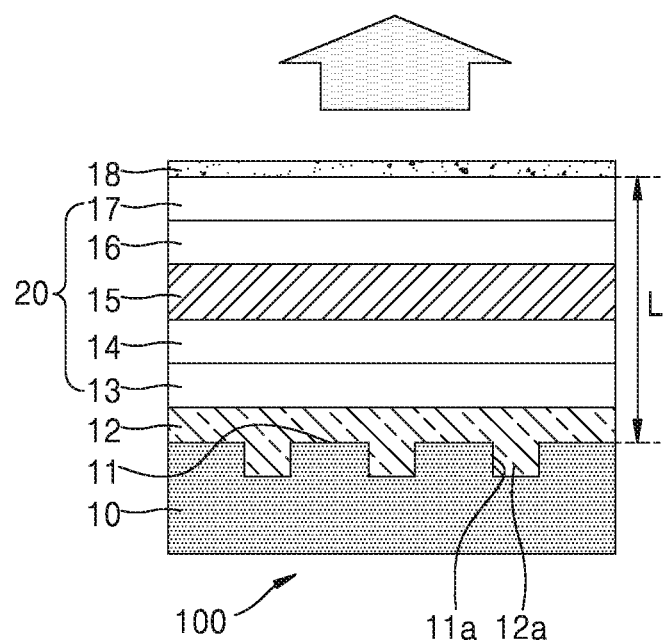
FIG. 1 is a cross-sectional view schematically showing a structure of a light emitting device according to an exemplary embodiment.

Hereinafter, with reference to the accompanying drawings, a holographic display apparatus for providing an expanded viewing window will be described in detail. Like reference numerals refer to like elements throughout, and in the drawings, sizes of elements may be exaggerated for clarity and convenience of explanation. The embodiments described below are merely exemplary, and various modifications may be possible from the embodiments. In a layer structure described below, an expression "above" or "on" may include not only "immediately on in a contact manner" but also "on in a non-contact manner".

FIG. 1 is a cross-sectional view schematically showing a structure of a light emitting device 100 according to an exemplary embodiment. Referring to FIG. 1, the light emitting device 100 according to an exemplary embodiment may include a reflective layer 10 having a phase modulation surface 11, a first electrode 12 disposed on the phase modulation surface 11 of the reflective layer 10, a light emitting structure 20 disposed on the first electrode 12, and a second electrode 18 disposed on the light emitting structure 20. The first electrode 12 may have a protruding pattern 12a.

The light emitting device 100 may be an organic light emitting diode (OLED). In an exemplary embodiment, the light emitting structure 20 may include a hole injection layer 13 disposed on the first electrode 12, a hole transport layer 14 disposed on the hole injection layer 13, an organic emission layer 15 disposed on the hole transport layer 14, an electron transport layer 16 disposed on the organic emission layer 15, and an electron injection layer 17 disposed on the electron transport layer 16. Also, the light emitting structure 20 may include various additional layers as needed. In an exemplary embodiment, the light emitting structure 20 may further include an electron block layer between the hole transport layer 14 and the organic emission layer 15, and may further include a hole block layer between the organic emission layer 15 and the electron transport layer 16. In this structure, holes provided through the hole injection layer 13 and the hole transport layer 14 and electrons provided through the electron injection layer 17 and the electron transport layer 16 may combine in the organic emission layer 15, thereby generating light. A wavelength of the generated light may be determined according to an energy band gap of a light emitting material of the organic emission layer 15.

A structure of the OLED described above is only an example of the light emitting device 100, and the light emitting device 100 is not limited to the OLED. Thus, the structure and principle of the light emitting device 100 according to the present embodiment may be applied to an inorganic light emitting diode. Hereinafter, it is assumed that the light emitting device 100 is an OLED.

The first electrode 10 disposed between the reflective layer 10 and the light emitting structure 20 may be a transparent electrode having a property of transmitting light (e.g., visible light) and may serve as an anode for providing holes. The second electrode 18 disposed on an upper portion of the light emitting structure 20 may be a transflective electrode that reflects a part of light and transmits another part of the light, and may serve as a cathode for providing electrons. To this end, the first electrode 10 may include a material having a relatively high work function, and the second electrode 18 may include a material having a relatively low work function. In an exemplary embodiment, the first electrode 12 may include a transparent conductive oxide such as ITO (indium tin oxide), IZO (indium zinc oxide), or AZO (aluminum zinc oxide). Also, the second electrode 18 may include a reflective metal of a very thin thickness. In an exemplary embodiment, the second electrode 18 may be a mixed layer of silver (Ag) and magnesium (Mg), or a mixed layer of aluminum (Al) and lithium (Li), and an entire thickness of the second electrode 18 may be about 10 nm to about 20 nm. Since the thickness of the second electrode 18 is very thin, a part of the light may pass through the reflective metal.

The reflective layer 10 may serve to form a micro cavity L together with the second electrode 18. In other words, the micro cavity L may be formed between the reflective layer 10 and the second electrode 18 of the light emitting device 100. In an exemplary embodiment, light generated in the light emitting structure 20 may reciprocate and resonate between the reflective layer 10 and the second electrode 18 and then light corresponding to a resonance wavelength of the micro cavity L may be emitted to the outside through the second electrode 18.

The resonance wavelength of the micro cavity L may be determined according to an optical length of the micro cavity L. For example, when the resonance wavelength of the micro cavity L is $\lambda$, the optical length of the micro cavity L may be $n \times \lambda/2$, wherein n is a natural number. The optical length of the micro cavity L may be determined as a sum of an optical thickness of the light emitting structure 20 and the first electrode 12, a phase delay caused by the second electrode 18, and a phase shift (e.g., a phase delay) caused by the reflective layer 10. Here, the optical thickness of the light emitting structure 20 and the first electrode 12 may not be merely a physical thickness but may be a thickness in consideration of refractive indexes of materials of the light emitting structure 20 and the first electrode 12. For example, the optical thickness of the light emitting structure 20 may refer to the sum of the respective products of the physical thicknesses of the layers in the light emitting structure 20 and the refractive indices of the layers in the light emitting structure 20 and the optical thickness of the first electrode 12 may refer to the product of the physical thickness of the first electrode 12 and the refractive index of the first electrode 12. According to the present embodiment, the optical length or the resonance wavelength of the micro cavity L may be determined by adjusting only the phase shift caused by the reflective layer 10 while keeping the optical thickness of the light emitting structure 20 and the first electrode 12 and the phase delay caused by the second electrode 18 constant.

The phase modulation surface 11 may be formed on a reflective surface of the reflective layer 10 in contact with the first electrode 12 to adjust the phase shift by the reflective layer 10. The phase modulation surface 11 may include very small nanoscaled patterns 11a. The protruded portions of the nanoscaled patterns 11a and the produced portions of the protruding pattern 12a may be arranged alternately. In an exemplary embodiment, FIG. 2A is a cross-sectional view schematically illustrating a structure of the reflective layer 10 including the phase modulation surface 11 having the plurality of patterns 11a, FIG. 2B is a plan view of an example of showing an arrangement of the plurality of patterns 11a of the phase modulation surface 11, and FIG. 2C is a perspective view of an example showing the arrangement of the plurality of patterns 11a of the phase modulation surface 11.

Figure 2A:
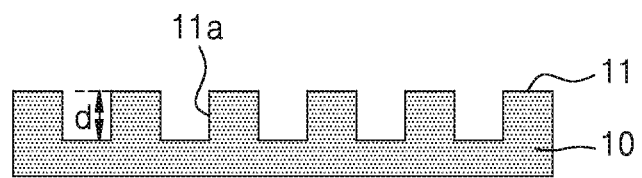
FIG. 2A is a cross-sectional view schematically illustrating a structure of a reflective layer including a phase modulation surface having a plurality of patterns.
Figure 2B:
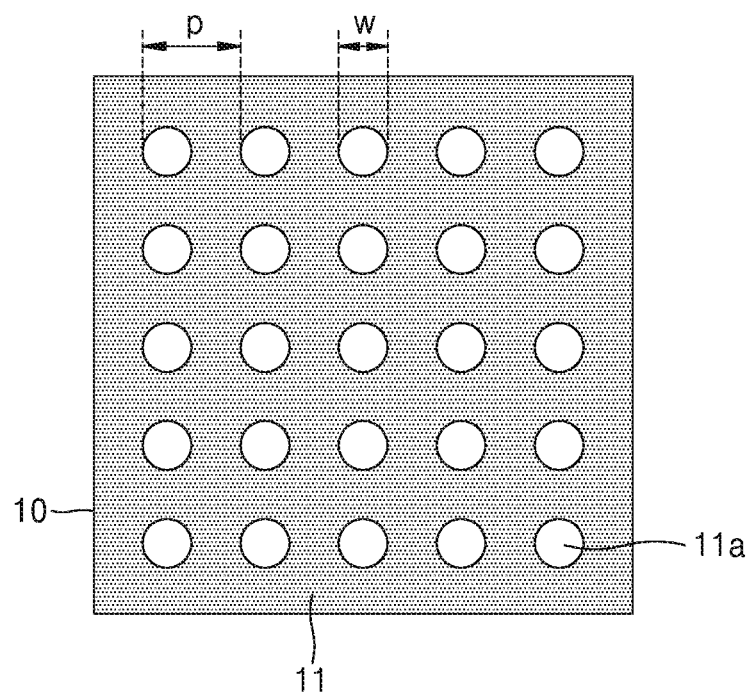
FIG. 2B is a plan view of an example showing an arrangement of a plurality of patterns of a phase modulation surface.
Figure 2C:
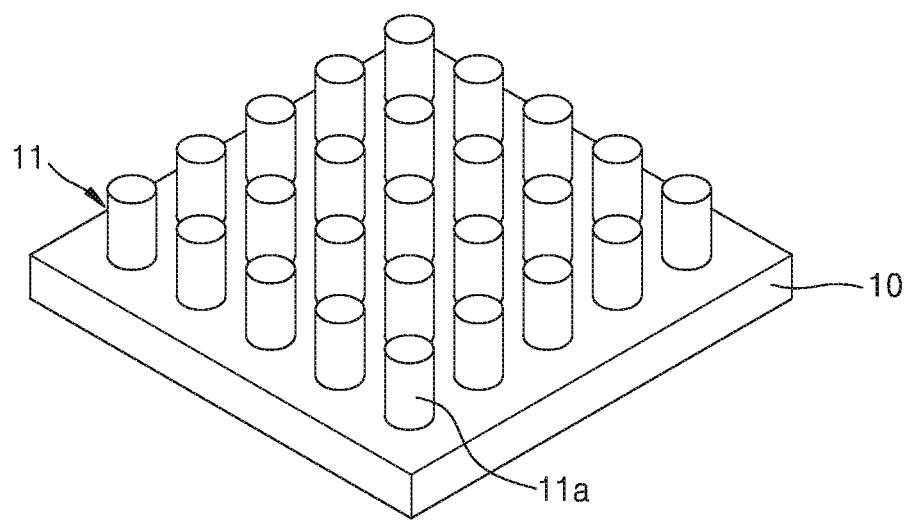
FIG. 2C is a perspective view of an example showing an arrangement of a plurality of patterns of a phase modulation surface.

Referring to FIGS. 2A to 2C, the phase modulation surface 11 of the reflective layer 10 may include the plurality of nanoscale patterns 11a. In an exemplary embodiment, each pattern 11a may have a column shape protruding from the uppermost surface of the reflective layer 10. In FIG. 2C, each pattern 11a has a cylindrical shape, but is not necessarily limited thereto. In an exemplary embodiment, each pattern 11a may have an elliptical column shape, a quadrangular column shape, or a polygonal column shape more than a pentagon.

In order to prevent the micro cavity L from having polarization dependence, the plurality of patterns 11a may be regularly and periodically arranged to have a 4-fold symmetry characteristic. When the micro cavity L has the polarization dependence, since only light of a specific polarization component resonates, the light emitting efficiency of the light emitting device 100 may deteriorate. In an exemplary embodiment, in FIG. 2B, the plurality of patterns 11a are arranged in an array of regular square patterns. In this case, distances between the two adjacent patterns 11a in the entire region of the phase modulation surface 11 may be constant. However, when the plurality of patterns 11a have the 4-fold symmetry characteristic, the plurality of patterns 11a may be arranged in any other types of arrays. Instead, the plurality of patterns 11a may be irregularly arranged. Even when the plurality of patterns 11a are irregularly arranged, the micro cavity L may not have the polarization dependence. In another embodiment, the arrangement of the plurality of patterns 11a may be designed differently from the 4-fold symmetry such that the light emitting device 100 intentionally emits only the light of the specific polarization component. The plurality of patterns 11a may refer to a plurality of columns protruding from the reflective layer 10. The pitch between two successive columns 11a may be constant.

When each pattern 11a is, for example, cylindrical, the optical characteristics (e.g., the phase delay of reflected light) of the phase modulation surface 11 may be determined according to a diameter w of each pattern 11a, a height d of each pattern 11a, and a pitch or period p of the plurality of patterns 11a. When each pattern 11a is, for example, a polygonal column, the optical characteristics of the phase modulation surface 11 may be determined according to the width w of each pattern 11a, the height d of each pattern 11a, and the pitch or period p of the plurality of patterns 11a. In addition, the diameter w, height d, and the period p of the patterns 11a may be constant with respect to the entire region of the phase modulation surface 11.

Therefore, the resonance wavelength of the micro cavity L may be determined according to the diameter w of each pattern 11a of the phase modulation surface 11, the height d of each pattern 11a, and the period p of the plurality of patterns 11a. In other words, when the resonance wavelength of the micro cavity L is $\lambda$, the diameter w of each pattern 11a of the phase modulation surface 11, the height d of each pattern 11a, and the period p of the plurality of patterns 11a may be selected such that the optical length of the micro cavity L is equal to $n \times \lambda/2$, wherein n is a natural number. In an exemplary embodiment, the diameter w of each pattern 11a of the phase modulation surface 11 may be about 50 nm to about 150 nm, the height d of each pattern 11a of the phase modulation surface 11 may be 0 nm to about 150 nm, and the period p of the plurality of patterns 11a of the phase modulation surface 11 may be about 100 nm to about 300 nm.

When a size of each pattern 11a of the phase modulation surface 11 is less than the resonance wavelength as described above, a plurality of nano light resonance structures may be formed while incident light resonates at the periphery of the patterns 11a. In particular, in the incident light, an electric field component may not penetrate into a space between the patterns 11a and only a magnetic field component may resonate at the periphery of the patterns 11a. Therefore, the plurality of nano light resonance structures formed in the space between the patterns 11a may be cylindrical type magnetic resonators in which the magnetic field component of the incident light resonates at the periphery of the patterns 11a. As a result, a phase shift greater than a simple phase shift by an effective optical distance (d×n), which is determined by multiplying the height d of the patterns 11a by a refractive index n of the patterns 11a, may occur in the phase modulation surface 11.

Figure 3:
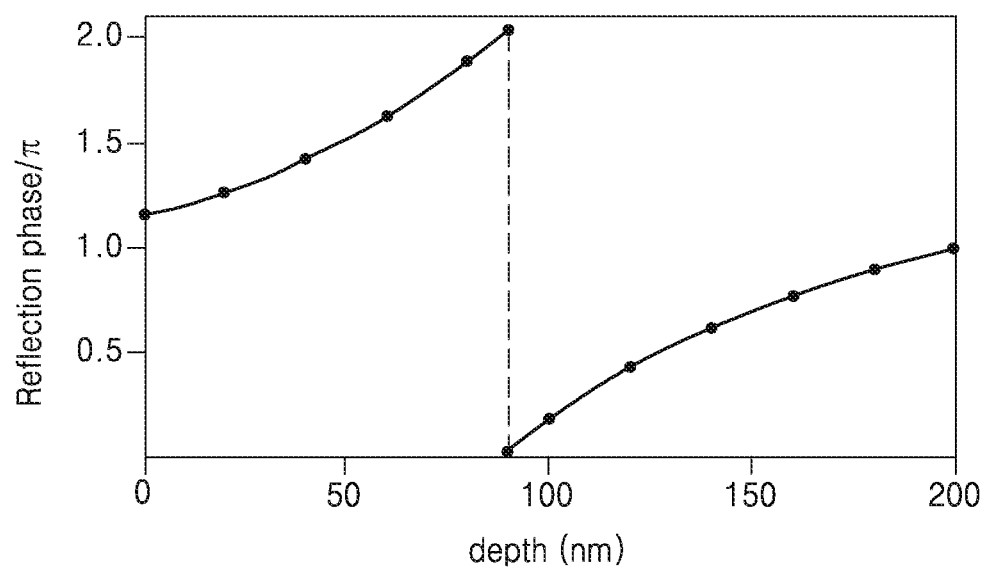
FIG. 3 is a graph of an example showing a phase change of reflected light by a reflective layer according to a height of a pattern of a phase modulation surface.
Figure 4:
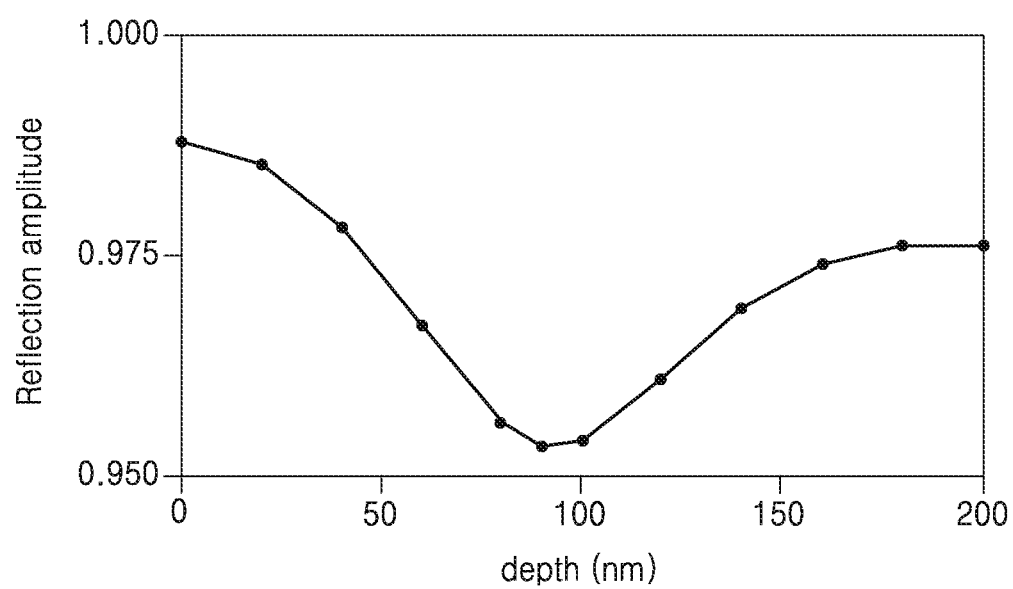
FIG. 4 is a graph of an example showing a reflectance change of a reflective layer according to a height of a pattern of a phase modulation surface.

In an exemplary embodiment, FIG. 3 is a graph of an example showing a phase change of reflected light by the reflective layer 10 according to the height d of the pattern 11a of the phase modulation surface 11, and FIG. 4 is a graph of an example showing a reflectance change of the reflective layer 10 according to the height d of the pattern 11a of the phase modulation surface 11. Referring to FIG. 3, it may be seen that a phase of the reflected light varies from 0 to $2\pi$ according to the height d of the pattern 11a. Therefore, phase modulation of the entire range from 0 to $2\pi$ may be possible by appropriately selecting the height d of the pattern 11a, and thus the resonance wavelength of the micro cavity L may be easily adjusted only by the change in the height d of the pattern 11a. Also, referring to FIG. 4, although the reflectance of the reflective layer 10 changes according to the height d of the pattern 11a, the minimum reflectance of the reflective layer 10 may be maintained at 95% or more, the micro cavity L may have a sufficiently high efficiency.

The optical characteristics of the phase modulation surface 11 described above may also vary depending on a material of the reflective layer 10. For example, in the present embodiment, the reflective layer 10 may include a metal. For example, the reflective layer 10 may include silver (Ag) or an Ag alloy including silver (Ag).

Figure 5:
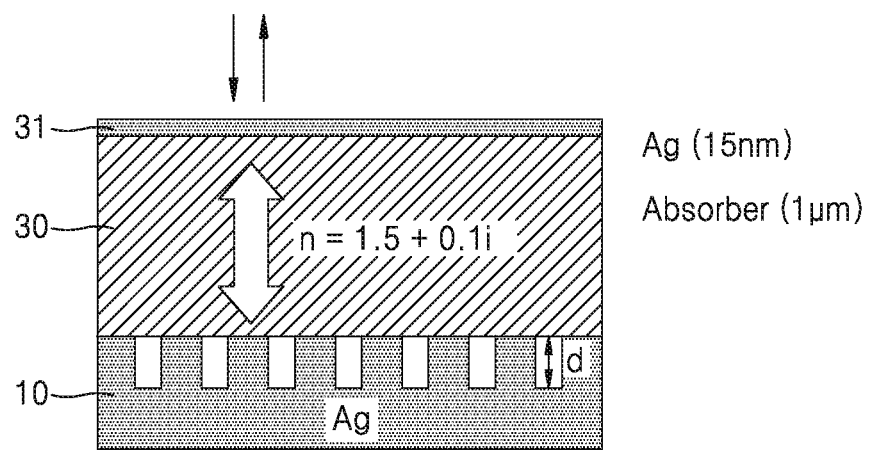
FIG. 5 is a cross-sectional view showing an exemplary configuration of a micro cavity for testing resonance characteristics of the micro cavity.

FIG. 5 is a cross-sectional view showing an exemplary configuration of the micro cavity L for testing resonance characteristics of the micro cavity L including the reflective layer 10 having the phase modulation surface 11 described above. Referring to FIG. 5, the micro cavity may include the reflective layer 10 including silver (Ag), an absorption layer 30 disposed on the reflective layer 10, and a transflective mirror 31 disposed on the absorption layer 30. The transflective mirror 31 may include silver (Ag) having a thickness of 15 nm. Further, the absorption layer 30 has a thickness of 1 μm and a complex refractive index of 1.5+0.1i, where i is an imaginary number. In this case, light may be most strongly absorbed by the absorption layer 30 at a resonance wavelength of the micro cavity L.

Figure 6:
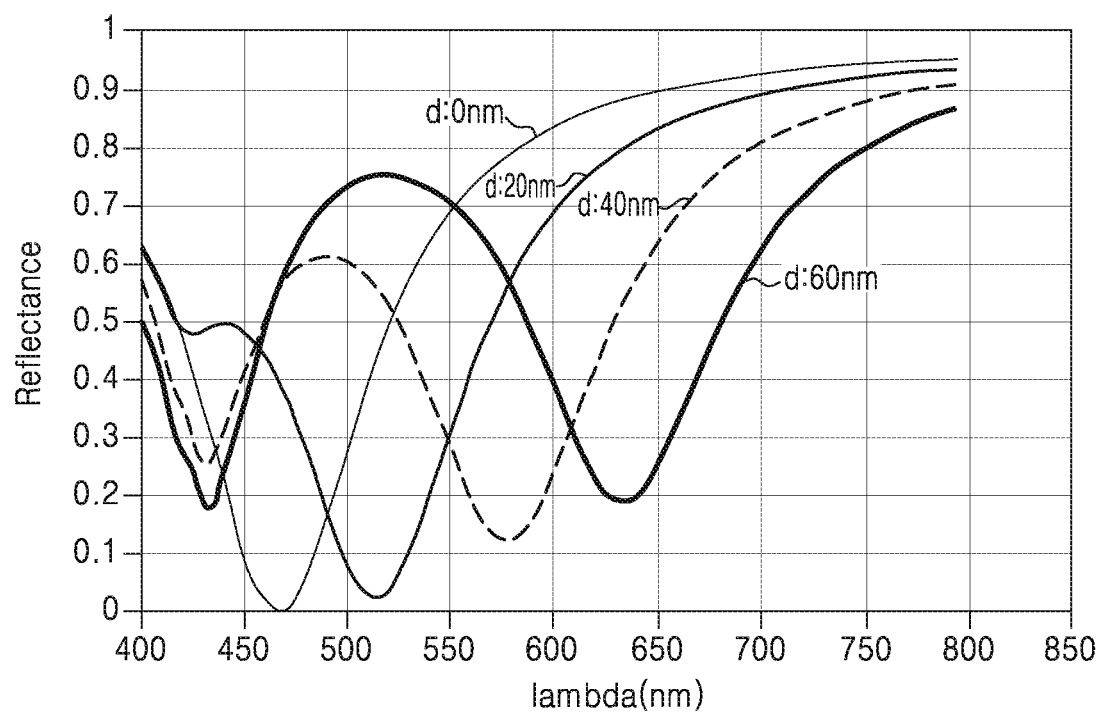
FIG. 6 is a graph showing resonance characteristics of the micro cavity according to a height of each pattern of a phase modulation surface in the micro cavity shown in FIG. 5.

In an exemplary embodiment, FIG. 6 is a graph showing resonance characteristics of the micro cavity L according to the height d of each pattern 11a of the phase modulation surface 11 in the micro cavity L shown in FIG. 5. The graph of FIG. 6 may be obtained by simulating an amount of light emitted again through the transflective mirror 31 after the light enters the transflective mirror 31 of the micro cavity L shown in FIG. 5. Referring to FIG. 6, when the height d of the pattern 11a is 0 nm, the largest absorption may occur at a wavelength of about 460 nm. In other words, when the height d of the pattern 11a is 0 nm, the resonance wavelength of the micro cavity L may be about 460 nm. Also, it may be seen that as the height d of the pattern 11a increases, the resonance wavelength of the micro cavity L increases. In an exemplary embodiment, when the height d of the pattern 11a is 60 nm, the resonance wavelength of the micro cavity L may be about 640 nm.

As described above, it may be seen that as a phase shift due to the phase modulation surface 11 increases, the resonance wavelength of the micro cavity L increases, and the resonance wavelength of the micro cavity L in a visible light wavelength band may be adjusted only by the height d of the pattern 11a. Also, the resonance wavelength of the micro cavity L may be adjusted by the diameter w of each pattern 11a and the period p of the patterns 11a like the height d of each pattern 11a. On the other hand, a resonance wavelength bandwidth of the micro cavity L may be adjusted by adjusting a thickness of the transflective mirror 31. To reduce the resonance wavelength bandwidth (or a full width at half maximum) of the micro cavity L, the reflectance of the transflective mirror 31 may need to increase.

The transflective mirror 31 shown in FIG. 5 may correspond to the second electrode 18 of the light emitting device 100 shown in FIG. 1. The absorption layer 30 shown in FIG. 5 may correspond to the light emitting structure 20 and the first electrode 12 of the light emitting device 100. Therefore, in the light emitting device 100 according to the present embodiment, the resonance wavelength of the micro cavity L may be adjusted by adjusting only a phase shift caused by the reflective layer 10 while setting an optical thickness of the light emitting structure 20 and the first electrode 12 and a phase delay caused by the second electrode 18 to a fixed value. In other words, the light emitting device 100 including the micro cavity L may easily match the resonance wavelength of the micro cavity L with a light emitting wavelength or a light emitting color of the light emitting device 100 by appropriately selecting the diameter w of each pattern 11a of the phase modulation surface 11, the height d of each pattern 11a, and the period p of the plurality of patterns 11a. Also, the reflectance of the reflective layer 10 including the phase modulation surface 11 is sufficiently high, thereby obtaining an excellent light emitting efficiency.

In an exemplary embodiment, when the light emitting device 100 is a red light emitting device, the diameter w of each pattern 11a of the phase modulation surface 11, the height d of each pattern 11a, and the period p of the plurality of patterns 11a may be selected such that the resonance wavelength of the micro cavity L corresponds to a red wavelength band. The organic emission layer 15 may include a red light emitting material. Instead, the organic emission layer 15 may include all of a blue light emitting material, a green light emitting material, and a red light emitting material, and may determine the light emitting wavelength of the light emitting element 100 only by a structure of the phase modulation surface 11.

Referring again to FIG. 1, a part of the first electrode 12 may be filled in a peripheral space of the patterns 11*a* of the phase modulation surface 11. The peripheral space may have a plurality of concave or depressed areas. Thus, a lower surface of the first electrode 12 may have a protruding pattern 12*a* that is complementary to the phase modulation surface 11.

Figure 7:
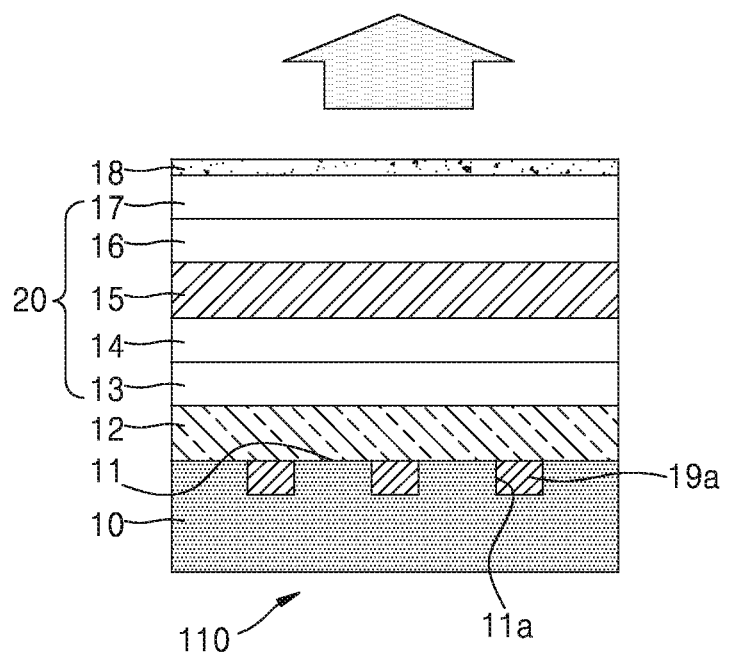
FIG. 7 is a cross-sectional view schematically showing a structure of a light emitting device according to another exemplary embodiment.

FIG. 7 is a cross-sectional view schematically showing a structure of a light emitting device 110 according to another exemplary embodiment. Referring to FIG. 7, the light emitting device 110 may further include a dielectric substance 19*a* filled in a peripheral space of the patterns 11*a* of the phase modulation surface 11. In an exemplary embodiment, the dielectric substance 19*a* may include a transparent and insulating material with respect to visible light such as $SiO_2$, $SiN_x$, $Al_2O_3$, $HfO_2$, and the like. A resonance wavelength of the micro cavity L may be finely adjusted according to a refractive index of the dielectric substance 19*a*. An upper surface of the dielectric substance 19*a* may be identical to the uppermost surface of the reflective layer 10. In this case, a lower surface of the first electrode 12 may have a flat shape.

Figure 8:
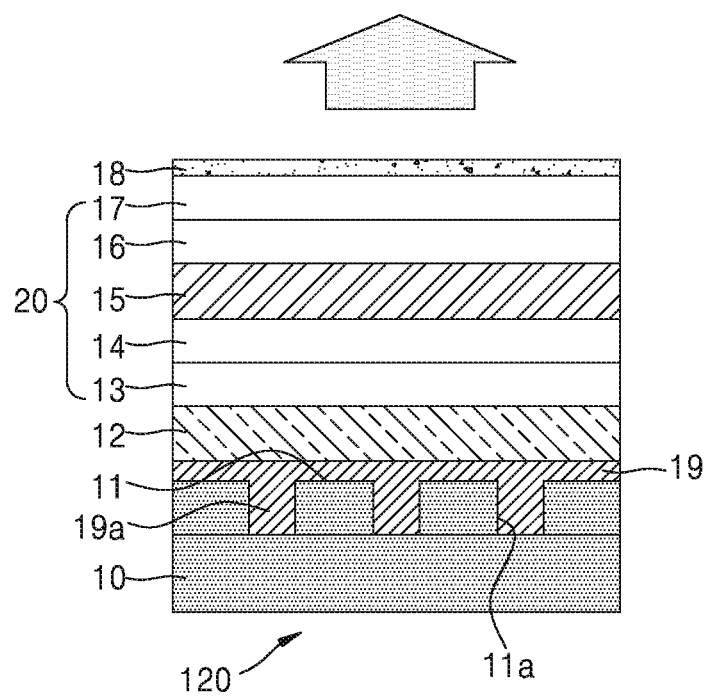
FIG. 8 is a cross-sectional view schematically showing a structure of a light emitting device according to an exemplary embodiment.

FIG. 8 is a cross-sectional view schematically showing a structure of a light emitting device 120 according to another exemplary embodiment. Referring to FIG. 8, the light emitting device 110 may further include a dielectric layer 19 disposed between the phase modulation surface 11 and the first electrode 12. In an exemplary embodiment, the dielectric layer 19 may include a transparent and insulating material with respect to visible light such as $SiO_2$, $SiN_x$, $Al_2O_3$, $HfO_2$, and the like. The partial dielectric substance 19*a* of the dielectric layer 19 may be filled in a peripheral space of the patterns 11*a* of the phase modulation surface 11. A material of the dielectric layer 19 may be the same as a material of the dielectric substance 19*a* filled in the peripheral space of the patterns 11*a*, but needs not necessarily be the same. When the material of the dielectric layer 19 is the same as the material of the dielectric substance 19*a* filled in the peripheral space of the patterns 11*a*, the dielectric layer 19 may be formed such that the dielectric substance 19*a* shown in FIG. 7 extends over the uppermost surface of the reflective layer 10. With this structure, the resonance wavelength of the micro cavity L may be finely adjusted according to refractive indexes of the materials of the dielectric layer 19 and the dielectric substance 19*a* and a height of the dielectric layer 19.

Figure 9:
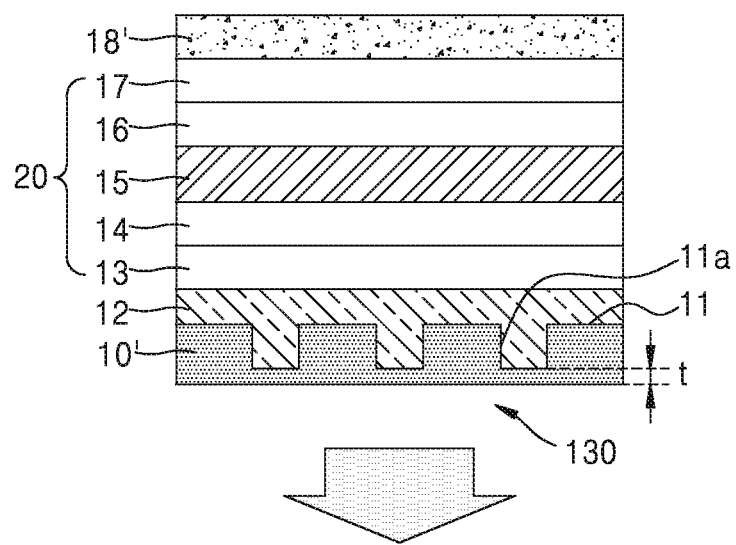
FIG. 9 is a cross-sectional view schematically showing a structure of a light emitting device according to an exemplary embodiment.

The configuration in which the second electrode 18 is a transflective electrode and light is emitted to the outside through the second electrode 18 has been described. However, a configuration in which light is emitted in the opposite direction may be also possible. For example, FIG. 9 is a cross-sectional view schematically showing a structure of a light emitting device 130 according to another exemplary embodiment. Referring to FIG. 9, the light emitting device 130 may include a reflective layer 10' having the phase modulation surface 11, the first electrode 12 disposed on the phase modulation surface 11 of the reflective layer 10', the light emitting structure 20 disposed on the first electrode 12, and a second electrode 18' disposed on the light emitting structure 20. The structure of the light emitting structure 20 may have the same structure as that described in FIG. 1.

In the exemplary embodiment shown in FIG. 9, the second electrode 18' may be a reflective electrode that mostly reflects light. For example, the second electrode 18' may include a reflective metal material having a thickness of 50 nm or more. The reflective layer 10' may be thin to have a transflective property that reflects a part of light and transmits the remaining part. For example, a thickness t between the bottom of a peripheral space of the patterns 11*a* in the reflective layer 10' and a lower surface of the reflective layer 10' may be about 10 nm to about 20 nm. Then, after light generated in the light emitting structure 20 reciprocates and resonates between the reflective layer 10' and the second electrode 18', light corresponding to the resonance wavelength of the micro cavity L may be emitted to the outside through the reflective layer 10'.

On the other hand, the first electrode 12 is a transparent electrode including a transparent conductive material. As shown in FIG. 9, a part of the first electrode 12 may be filled in the peripheral space of the patterns 11*a* of the phase modulation surface 11 of the reflective layer 10'. Instead, like the configuration shown in FIG. 7 or 8, the light emitting device 130 may further include the dielectric substance 19*a* filled in the peripheral space of the patterns 11*a* of the phase modulation surface 11, or may include the dielectric layer 19 disposed between the phase modulation surface 11 and the first electrode 12.

Figure 10:
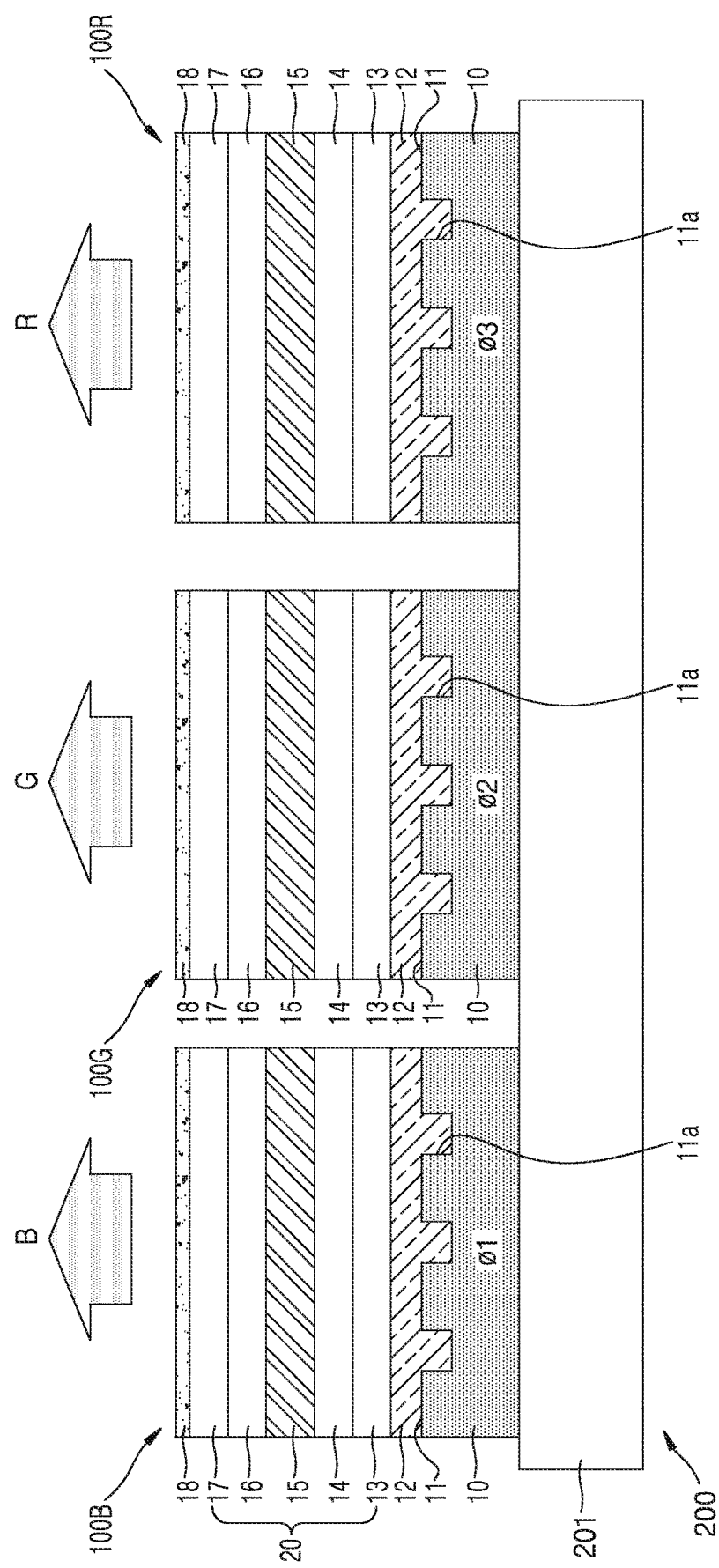
FIG. 10 is a cross-sectional view schematically showing a structure of a display apparatus according to an exemplary embodiment.

The above-described light emitting devices 100, 110, 120, and 130 may be applied to a display apparatus since they may adjust a resonance wavelength of a micro cavity within a wavelength band of visible light according to a structure of the phase modulation surface 11. For example, FIG. 10 is a cross-sectional view schematically showing a structure of a display apparatus 200 according to an exemplary embodiment. Referring to FIG. 10, the display apparatus 200 according to an exemplary embodiment may include a substrate 201 and a first pixel 100B, a second pixel 100G, and a third pixel 100R arranged on the substrate 201 in a line. Although the first through third pixels 100B, 100G, and 100R shown in FIG. 10 have the same structure as the light emitting device 100 shown in FIG. 1, the first through third pixels 100B, 100G, and 100R may have the same structures as the light emitting devices 110, 120, and 130 shown in FIGS. 7 to 9. Also, although only one of the first through third pixels 100B, 100G, and 100R is illustrated in FIG. 10 for the sake of convenience, a very large number of the first through third pixels 100B, 100G, and 100R may be repeatedly arranged actually.

For example, each of the first to third pixels 100B, 100G, and 100R may include the reflective electrode 10 disposed on the substrate 201 and including the phase modulation surface 11, the first electrode 12 disposed on the phase modulation surface 11 of the reflective electrode 10, the light emitting structure 20 disposed on the first electrode 12, and the second electrode 18 disposed on the light emitting structure 20. When the display apparatus 200 is an OLED apparatus, the light emitting structure 20 of each of the first to third pixels 100B, 100G and 100R may include the hole injection layer 13 disposed on the first electrode 12, the hole transport layer 14 disposed on the hole injection layer 13, the organic emission layer 15 disposed on the hole transport layer 14, the electron transport layer 16 disposed on the organic emission layer 15, and the electron injection layer 17 disposed on the electron transport layer 16.

The first to third pixels 100B, 100G, and 100R may be configured to emit light of different wavelengths. For example, the first pixel 100B may be configured to emit light B of a first wavelength band $\lambda_1$ that is a blue wavelength band, the second pixel 100G may be configured to emit light G of a second wavelength band $\lambda_2$ that is a green wavelength band, and the third pixel 100R may be configured to emit light R of a third wavelength band $\lambda_3$ that is a red wavelength band. To this end, optical lengths of micro cavities of the first through third pixels 100B, 100G, and 100R may be configured to be different from each other.

As described above, the optical length of the micro cavity may be determined as a sum of an optical thickness of the light emitting structure 20 and the first electrode 12, a phase delay caused by the second electrode 18, and a phase shift caused by the reflective layer 10. In other words, a resonance wavelength of the micro cavity may be determined according to an optical distance between the reflective layer 10 and the second electrode 18 and the phase shift by a nano light resonance structure of the reflective layer 10. According to the present embodiment, the optical length or the resonance wavelength of the micro cavity may be adjusted by adjusting only the phase shift caused by the reflective layer 10 while fixing the optical thickness of the light emitting structure 20 and the first electrode 12 and the phase delay caused by the second electrode 18, and/or fixing the optical distance between the reflective layer 10 and the second electrode 18 and the phase delay caused by the second electrode 18. The optical distance between the reflective layer 10 and the second electrode 18 may refer to the product of the geometric length that a light follows through the reflective layer 10 and the second electrode 18, and the index of refraction of the medium (i.e., the index of refraction of the reflective layer 10, the second electrode 18, and the materials 12-17 therebetween) through which the light travels. For example, a phase delay $\varphi_1$ caused by the reflective layer 10 of the first pixel 100B, a phase delay $\varphi_2$ caused by the reflective layer 10 of the second pixel 100G, and a phase delay $\varphi_3$ caused by the reflective layer 10 of the third pixel 100R may be configured to be different from each other.

In other words, the diameter w of the patterns 11a of the phase modulation surface 11 of the first pixel 100B, the height d of the patterns 11a, and the period p of the patterns 11a may be selected such that the resonance wavelength of the micro cavity of the first pixel 100B corresponds to the first wavelength band $\lambda_1$, the diameter w of the patterns 11a of the phase modulation surface 11 of the second pixel 100G, the height d of the patterns 11a, and the period p of the patterns 11a may be selected such that the resonance wavelength of the micro cavity of the second pixel 100G corresponds to the second wavelength band $\lambda_2$, and the diameter w of the patterns 11a of the phase modulation surface 11 of the third pixel 100R, the height d of the patterns 11a, and the period p of the patterns 11a may be selected such that the resonance wavelength of the micro cavity of the third pixel 100R corresponds to the third wavelength band $\lambda_3$.

More specifically, the diameter w of the patterns 11a of the phase modulation surface 11 of the first pixel 100B, the height d of the patterns 11a, and the period p of the patterns 11a may be selected such that the optical length of the micro cavity of the first pixel 100B is $n \times \lambda_1/2$, the diameter w of the patterns 11a of the phase modulation surface 11 of the second pixel 100G, the height d of the patterns 11a, and the period p of the patterns 11a may be selected such that the optical length of the micro cavity of the second pixel 100G is $n \times \lambda_2/2$, and the diameter w of the patterns 11a of the phase modulation surface 11 of the third pixel 100R, the height d of the patterns 11a, and the period p of the patterns 11a may be selected such that the optical length of the micro cavity of the third pixel 100R is $n \times \lambda_3/2$. Here, n may be a natural number.

As described above, the optical length of the micro cavity may be adjusted according to the diameter w of the patterns 11a of the phase modulation surfaces 11, the height d of the patterns 11a, and the period p of the patterns 11a. Therefore, since it is unnecessary to adjust a thickness of each of the first through third pixels 100B, 100G, and 100R to adjust the optical length of the micro cavity, the display apparatus 200 may configure the physical thicknesses of the first through third pixels 100B, 100G and 100R to be the same. For example, physical lengths between the second electrode 18 and the phase modulation surface 11 in the first through third pixels 100B, 100G, and 100R may be the same. Accordingly, a manufacturing process of the display apparatus 200 may be simplified, and thus the display apparatus 200 may easily have a large area.

Meanwhile, the organic emission layers 15 of the first through third pixels 100B, 100G, and 100R may be configured differently. For example, the organic emission layer 15 of the first pixel 100B may include a light emitting material that emits blue light, the organic emission layer 15 of the second pixel 100G may include a light emitting material that emits green light, and the organic emission layer 15 of the third pixel 100R may include a light emitting material that emits red light. However, since light emitting characteristics of the first through third pixels 100B, 100G, and 100R may be determined only by a structure of the phase modulation surface 11, the organic emission layers 15 of the first through third pixels 100B, 100G, and 100R may be configured to be the identical to each other. For example, the organic emission layers 15 of the first through third pixels 100B, 100G, and 100R may include all the light emitting material that emits blue light, the light emitting material that emits green light, and the light emitting material that emits red light. When the organic emission layers 15 of the first through third pixels 100B, 100G, and 100R are the same, the manufacturing process of the display apparatus 200 may be further simplified.

Figure 11:
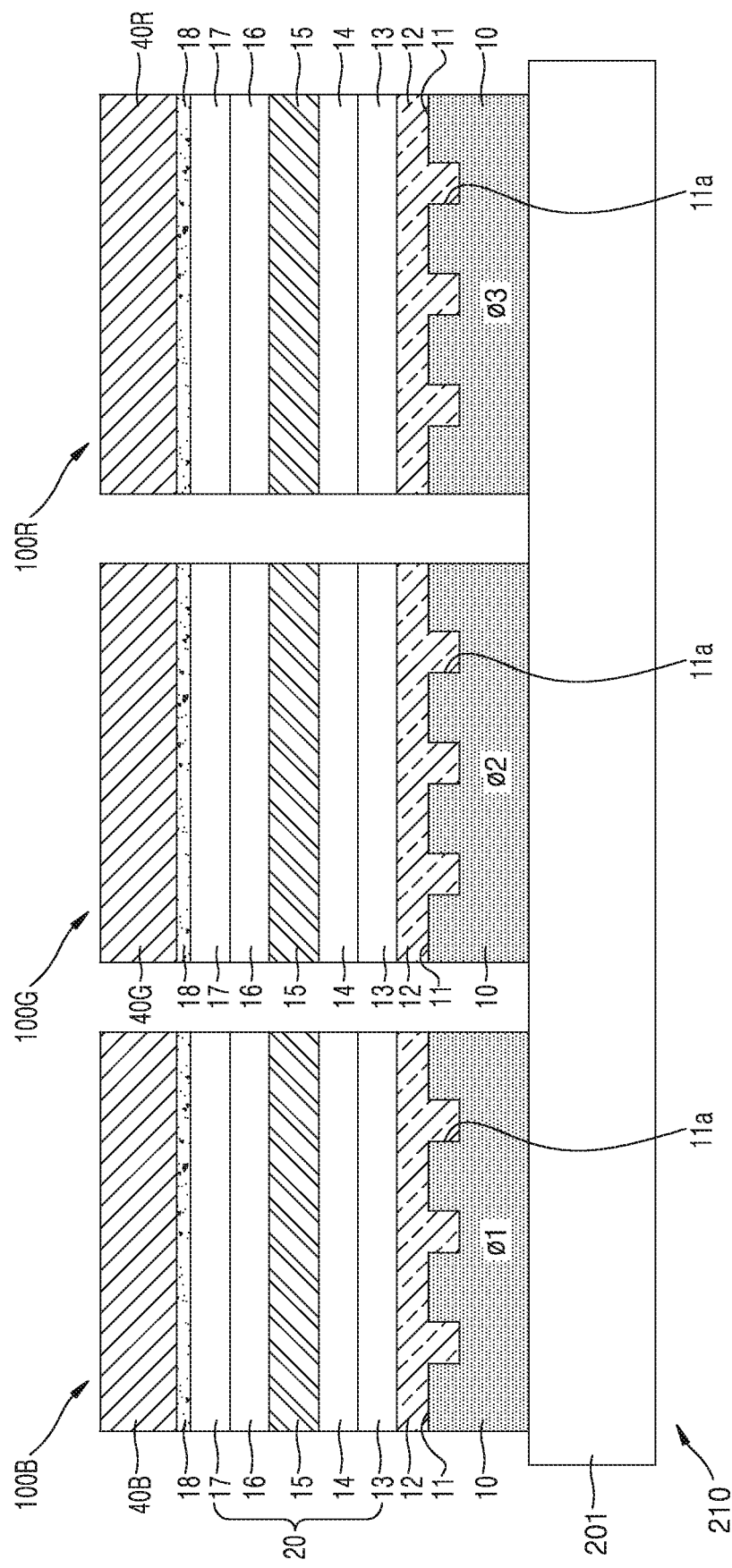
FIG. 11 is a cross-sectional view schematically showing a structure of a display apparatus according to another exemplary embodiment.

Further, since the light emitting characteristics of the first through third pixels 100B, 100G, and 100R may be determined only by structures of the phase modulation surfaces 11, the display apparatus 200 may not include a separate color filter. However, to further improve the color purity of the display apparatus 200, a color filter may be further disposed as necessary. For example, FIG. 11 is a cross-sectional view schematically showing a structure of a display apparatus 210 according to another embodiment. Referring to FIG. 11, the display apparatus 210 may include a first color filter 40B disposed on the first pixel 100B, a second color filter 40G disposed on the second pixel 100G, and a third color filter 40R disposed on the third pixel 100R. For example, the first color filter 40B may be configured to transmit only the light B of the first wavelength band $\lambda_1$ that is a blue wavelength band, the second color filter 40G may be configured to transmit only the light G of the second wavelength band $\lambda_2$ that is a green wavelength band, and the third color filter 40R may be configured to transmit only the light R of the third wavelength band $\lambda_3$ that is a red wavelength band. The remaining structure of the display apparatus 210 may be the same as the display apparatus 200 shown in FIG. 10.

While the light emitting device and the display apparatus including the light emitting device described above have been shown and described in connection with the embodiments illustrated in the drawings, it will be understood by those of ordinary skill in the art that various modifications and equivalent embodiments may be made therefrom. Therefore, the disclosed embodiments should be considered in an illustrative sense rather than a restrictive sense. The range of the embodiments will be in the appended claims, and all of the differences in the equivalent range thereof should be understood to be included in the embodiments.

What is claimed is:

1. A light emitting device comprising:
   a metal reflective layer comprising a phase modulation surface;
   a first electrode disposed on the phase modulation surface of the metal reflective layer;
   a second electrode disposed to oppose the first electrode; and
   a light emitting structure disposed between the first electrode and the second electrode to form a micro cavity having a resonance wavelength,
   wherein the phase modulation surface comprises a plurality of nano light resonance structures, the plurality of nano light resonance structures being column type magnetic resonators in which a magnetic field component of incident light resonates at a periphery of nano scale patterns, and
   wherein the resonance wavelength of the micro cavity is determined according to a phase delay caused by the plurality of nano light resonance structures and an optical distance between the metal reflective layer and the second electrode.

2. The light emitting device of claim 1,
   wherein the first electrode is a transparent electrode, and
   wherein the second electrode is a transflective electrode that reflects a part of light and transmits another part of the light.

3. The light emitting device of claim 2, wherein the second electrode comprises a reflective metal, and an entire thickness of the second electrode is about 10 nm to about 20 nm.

4. The light emitting device of claim 1,
   wherein the first electrode is a transparent electrode,
   wherein the second electrode is a reflective electrode, and
   wherein the metal reflective layer has a transflective property so that the metal reflective layer reflects a part of light and transmits another part of the light.

5. The light emitting device of claim 1, wherein the metal reflective layer comprises silver (Ag) or an alloy comprising silver (Ag).

6. The light emitting device of claim 1, wherein the phase modulation surface comprises a plurality of patterns that are regularly or irregularly arranged.

7. The light emitting device of claim 6, wherein a phase delay of reflected light caused by the phase modulation surface is greater than a phase delay by an effective optical distance determined by multiplying a height of the patterns by a refractive index of the patterns.

8. The light emitting device of claim 6, wherein a part of the first electrode is filled in a concave area of the patterns of the phase modulation surface.

9. The light emitting device of claim 6, further comprising:
   a dielectric substance filled in a concave area of the patterns of the phase modulation surface.

10. The light emitting device of claim 6, further comprising:
    a dielectric layer disposed between the phase modulation surface and the first electrode,
    wherein a part of the dielectric layer is filled in a concave area of the patterns of the phase modulation surface.

11. The light emitting device of claim 6, wherein a diameter of each of the patterns of the phase modulation surface is about 50 nm to about 150 nm.

12. The light emitting device of claim 6, wherein a height of each of the patterns of the phase modulation surface is 0 nm to about 150 nm.

13. The light emitting device of claim 6, wherein a period of the patterns of the phase modulation surface is about 100 nm to about 300 nm.

14. The light emitting device of claim 6, wherein when a resonance wavelength of the micro cavity is $\lambda$, a diameter of each of the patterns of the phase modulation surface, a height of each of the patterns, and a period of the patterns are selected such that an optical length of the micro cavity is equal to $n \times \lambda/2$, wherein n is a natural number.

15. The light emitting device of claim 1, wherein the light emitting structure comprises:
    a hole injection layer disposed on the first electrode;
    a hole transport layer disposed on the hole injection layer;
    an organic emission layer disposed on the hole transport layer;
    an electron transport layer disposed on the organic emission layer; and
    an electron injection layer disposed on the electron transport layer.

16. A display apparatus comprising:
    a first pixel configured to emit light of a first wavelength; and
    a second pixel configured to emit light of a second wavelength different from the first wavelength,
    wherein each of the first pixel and the second pixel comprises:
       a metal reflective layer comprising a phase modulation surface;
       a first electrode disposed on the phase modulation surface of the metal reflective layer;
       a second electrode disposed to oppose the first electrode; and
       a light emitting structure disposed between the first electrode and the second electrode to form a micro cavity having a resonance wavelength,
    wherein the phase modulation surface comprises a plurality of nano light resonance structures, the plurality of nano light resonance structures being column type magnetic resonators in which a magnetic field component of incident light resonates at a periphery of nano scale patterns, and
    wherein the resonance wavelength of the micro cavity being determined according to a phase delay caused by the plurality of nano light resonance structures and an optical distance between the metal reflective layer and the second electrode.

17. The display apparatus of claim 16,
    wherein the first electrode is a transparent electrode, and
    wherein the second electrode is a transflective electrode that reflects a part of light and transmits another part of the light.

18. The display apparatus of claim 17, wherein the second electrode comprises a reflective metal, and an entire thickness of the second electrode is about 10 nm to about 20 nm.

19. The display apparatus of claim 16,
    wherein the first electrode is a transparent electrode,
    wherein the second electrode is a reflective electrode, and
    wherein the metal reflective layer has a transflective property such that the metal reflective layer reflects a part of light and transmits another part of the light.

20. The display apparatus of claim 16, wherein the metal reflective layer comprises silver (Ag) or an alloy comprising silver (Ag).

21. The display apparatus of claim 16, wherein the phase modulation surface comprises a plurality of patterns that are regularly or irregularly arranged.

22. The display apparatus of claim 21, wherein a diameter of each of the patterns of the phase modulation surface of the first pixel, a height of each of the patterns, and a period of the patterns are selected such that the resonance wavelength of the micro cavity of the first pixel corresponds to the first wavelength, and
wherein a diameter of each of the patterns of the phase modulation surface of the second pixel, a height of each of the patterns, and a period of the patterns are selected such that the resonance wavelength of the micro cavity of the second pixel corresponds to the second wavelength.

23. The display apparatus of claim 21, wherein a part of the first electrode is filled in a concave area of the patterns of the phase modulation surface.

24. The display apparatus of claim 21, wherein each of the first pixel and the second pixel comprises a dielectric substance filled in a concave area of the patterns of the phase modulation surface.

25. The display apparatus of claim 21, wherein each of the first pixel and the second pixel comprise a dielectric layer disposed between the phase modulation surface and the first electrode,
wherein a part of the dielectric layer is filled in a concave area of the patterns of the phase modulation surface.

26. The display apparatus of claim 21, wherein a diameter of each of the patterns of the phase modulation surface is about 50 nm to about 150 nm, a height of each of the patterns of the phase modulation surface is 0 nm to about 150 nm, and a period of the patterns of the phase modulation surface is about 100 nm to about 300 nm.

27. The display apparatus of claim 21, wherein when a resonance wavelength of the micro cavity is $\lambda$, a diameter of each of the patterns of the phase modulation surface, a height of each of the patterns, and a period of the patterns are selected such that an optical length of the micro cavity is equal to $n \times \lambda/2$, wherein n is a natural number.

28. The display apparatus of claim 21,
wherein when the first wavelength is $\lambda_1$, and the second wavelength is $\lambda_2$, an optical length of the micro cavity of the first pixel is $n \times \lambda_1/2$, and an optical length of the micro cavity of the second pixel is $n \times \lambda_2/2$, where n is a natural number, and
wherein a physical distance between the second electrode and the phase modulation surface in the first pixel is same as a physical distance between the second electrode and the phase modulation surface in the second pixel.

29. The display apparatus of claim 16, wherein the light emitting structure comprises:
a hole injection layer disposed on the first electrode;
a hole transport layer disposed on the hole injection layer;
an organic emission layer disposed on the hole transport layer and configured to generate both the light of the first wavelength and the light of the second wavelength;
an electron transport layer disposed on the organic emission layer; and
an electron injection layer disposed on the electron transport layer.

30. The display apparatus of claim 16, wherein the light emitting structure comprises:
a hole injection layer disposed on the first electrode;
a hole transport layer disposed on the hole injection layer;
an organic emission layer disposed on the hole transport layer;
an electron transport layer disposed on the organic emission layer; and
an electron injection layer disposed on the electron transport layer,
wherein the organic emission layer of the first pixel is configured to generate the light of the first wavelength, and the organic emission layer of the second pixel is configured to generate the light of the second wavelength.

* * * * *